United States Patent
Ohtsuka et al.

[11] Patent Number: 6,150,698
[45] Date of Patent: *Nov. 21, 2000

[54] SEMICONDUCTOR DEVICE AND METHOD OF FORMING SEMICONDUCTOR DEVICE HAVING NON-UNIFORMLY DOPED WELL

[75] Inventors: Masaya Ohtsuka, Hyogo-ken; Takeshi Nanjyo, Kakogawa; Ikue Kawashima, Yokohama, all of Japan

[73] Assignee: Ricoh Company, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/005,724

[22] Filed: Jan. 13, 1998

[30] Foreign Application Priority Data

Jan. 13, 1997 [JP] Japan .................................. 9-017352

[51] Int. Cl.[7] .................................................. H01L 29/76
[52] U.S. Cl. ............................................ 257/371; 257/408
[58] Field of Search ................................. 257/408, 371, 257/372, 369, 376; 438/305, 229, 199, 231, 232

[56] References Cited

U.S. PATENT DOCUMENTS

| | | | |
|---|---|---|---|
| 5,292,671 | 3/1994 | Odanaka | 438/257 |
| 5,466,957 | 11/1995 | Yuki et al. | 257/408 |
| 5,489,540 | 2/1996 | Liu et al. | 438/232 |
| 5,814,866 | 9/1998 | Borland | 257/371 |

FOREIGN PATENT DOCUMENTS

| | | |
|---|---|---|
| 5129326 | 5/1993 | Japan . |
| 6112478 | 4/1994 | Japan . |

OTHER PUBLICATIONS

A Novel Source–to–Drain Nonuniformly Doped Channel (NUDC) MOSFET For High Current Drivability and Threshold Voltage Controllability, Okumura et al., IEDM Technical Digest 1990, pp. 15.5.1—15.5.4.

Primary Examiner—Michael Trinh
Attorney, Agent, or Firm—Cooper & Dunham LLP

[57] ABSTRACT

A MOS field effect transistor device and fabrication method thereof are provided, which include a non-uniformly doped well region composed of (1) a first portion thereof which is contiguous to a source or drain region, and situated under a gate electrode, and has a first concentration of said first conductive type impurities, and (2) a second portion which has a second concentration higher than the first concentration of said first conductive type impurities. This structure of the field effect transistor has advantages such as, for example, suppressing short channel effects, increasing source or drain junction breakdown voltages and improving high frequency characteristics of the transistor.

6 Claims, 5 Drawing Sheets

SEMICONDUCTOR DEVICE AND METHOD OF FORMING SEMICONDUCTOR DEVICE HAVING NON-UNIFORMLY DOPED WELL

BACKGROUND OF THE INVENTION

1. Field of the Invention

This invention relates generally to a semiconductor device and a process for fabricating the device. More specifically, the present invention relates to a MOS field effect transistor which includes a non-uniformly doped well region.

2. Description of the Related Art

As integration of semiconductor devices advances toward higher density, miniaturization of the devices continues. Although metal-oxide-semiconductor (MOS) field effect transistors are generally advantageous for the integration, there have arisen problems such as, for example, an increasing current leakage due to short channel effects as the miniaturization progresses.

Problems are caused by a widened depletion region and from increased normal electric field due to higher impurity concentration in a channel region.

In an attempt to obviate the above problems, there have been reported two transistor structures, in which, generally, a non-uniformly doped channel is formed on a semiconductor substrate. These two structures will be described herein below.

One structure is described as an NUDC (non-uniformly doped channel) structure by Okamura et al., Technical Digest of International Electron Devices Meeting, December 1990, page 391. This structure is composed of two channel portions in a well region, each having different net impurity concentrations.

A method for fabricating a field effect semiconductor with an NUDC structure has been disclosed in Japanese Laid-Open Patent Application No. 5-129326, to suppress short channel effects, increase a source or drain junction breakdown voltage and improve high frequency characteristics of the transistor.

According to the disclosure, and as shown in FIG. 5, a channel region between source and drain regions 19 in a semiconductor substrate 12, is composed of two portions. A first portion 16 is situated partially under a gate electrode 13 via insulating layer 14 and is contiguous to the source and drain junction regions, and has a low net impurity concentration. The other portion 11 is the remainder of the well, and has a high concentration of impurities of a conductive type opposite to that of the semiconductor substrate 12. The device also includes sidewalls 18, portions 17 and isolation layers 15.

The formation of the above-mentioned channel region is carried out by (1) forming a well region having a high impurity concentration by implanting first conductive type ions, and (2) subsequently forming the low net impurity concentration portion in the vicinity of the above-mentioned junction regions by counter doping, that is, by implanting ions having a second conductive type opposite to that of the first type, to compensate for some of the previously implanted first conductive type ions.

In the above-mentioned semiconductor device, however, a threshold voltage can not be sufficiently decreased To because the structure has a high impurity concentration region continuously disposed from a surface region between the source and drain regions under the gate electrode to inner portions of the well in contact with a semiconductor substrate.

The other semiconductor structure which has been disclosed in an attempt to obviate or minimize the aforementioned problems is described in Japanese Laid-Open Patent Application No. 6-112478.

According to the disclosure, a high impurity concentration layer of the same conductivity type as that of the substrate is formed in a channel part through an ion implantation method. Ions of a conductivity type opposite to that of the substrate are implanted to lessen the high impurity concentration layer of the channel part in impurity concentration near a diffusion layer. The high impurity concentration layer of the same conductivity type as that of the substrate 11 is located only near the center of the channel and lessened in impurity concentration near the source d rain diffusion layers.

However, a channel between the source and drain regions in this structure is implanted with ions having the same conductive type as that of the well region during the above channel implantation. Although some improvement in the punch-through effect may be achieved by this implantation, low voltage driving characteristics have not be en fulfilled for this structure.

It is noted that the depth profile of impurity concentration produced in a well region by high energy ion implantation is, in general, considerably different from that produced by a thermal diffusion process. Namely, the former produces a concentration profile such that an impurity concentration at the surface region is appreciably different from that inside the substrate, while the latter produces a profile relatively uniform with the depth from the surface of the semiconductor substrate.

To fabricate a MOS field effect transistor which is capable of operating at higher frequencies, it is necessary for a well region of the transistor to have (1) a low impurity concentration to decrease its source or drain junction capacitance, and (2) a high impurity concentration to increase its well junction breakdown voltage and thereby decrease the design rule for the transistor. In other words, as an ideal field effect transistor which is able to satisfy the requirements mentioned just above, a transistor preferably has a structure in which the well region as a whole has a high impurity concentration, while the junction regions of the source and drain regions have low impurity concentrations.

SUMMARY OF THE INVENTION

The general purpose of this invention is to provide an improved MOS field effect transistor and fabrication processes therefore, having most, if not all, of the advantages and features of similar employed devices and related processes, while eliminating many of the aforementioned disadvantages of other structures.

In one embodiment of the present invention, a field effect transistor includes a non-uniformly doped channel region composed of (1) a portion which is contiguous to source and drain regions and is situated under a gate electrode, and has a first net concentration of the first conductive type impurities, and (2) a second portion which has a second concentration higher than the first concentration of the first conductive type impurities.

In another embodiment, the present invention provides a method of fabricating a field effect transistor, including the steps of forming a well region in a semiconductor substrate by a thermal diffusion process, having a high impurity concentration of a first conductive type;

forming a gate electrode with an underlying insulation layer, by disposing a conductive layer and subsequently subjecting to a patterning process using a photolithography technology; and forming a portion of the well region having a low net concentration of the first conductive type ions by implanting ions into an area of the semiconductor substrate using the gate electrode as a mask, which are of a second conductive type opposite to the first conductive type, a predetermined dose, and an energy predetermined so that the ions are able to penetrate through the gate electrode and reach the surface of the semiconductor substrate, thereby the well region of the field effect transistor is formed, having (1) a relatively shallow portion thereof which is situated directly under the gate electrode used as a mask and (2) the remaining portion thereof deeper in the well region, which remains without the coverage by the gate electrode against the ion implantation, both portions being transformed to a net low concentration region of the first conductive type ions by compensating a part of previously diffused first conductive type ions by presently implanted second conductive type ions.

In still another embodiment, the present invention provides a method of fabricating a semiconductor device, including the steps of:

(i) forming a well region in a semiconductor substrate, having a high impurity concentration of a first conductive type by a thermal diffusion process;

(ii) forming a gate electrode with an underlying insulation layer, by disposing a conductive layer and subsequently subjecting to a patterning process using a photolithography technology;

(iii) forming a portion of the well region having a low net concentration of the first conductive type ions by implanting ions, into the entire area of the semiconductor substrate using the gate electrode as a mask, which are of a second conductive type opposite to the first conductive type, a predetermined dose and an energy predetermined so that the ions are able to penetrate through the gate electrode and reach a surface portion of the semiconductor substrate;

(iv) forming low impurity concentration portions of source and drain regions of an LDD structure by implanting ions which are of the second conductive type and have a predetermined energy and dose using the gate electrode as a mask;

(v) forming a pair of side walls on opposing walls of the gate electrode by disposing an insulation layer to a predetermined thickness and subsequently subjecting to an etch back process; and (vi) forming high net impurity concentration portions of source and drain regions by implanting ions which are of the second conductive type and have a predetermined energy and dose using the gate electrode and the pair of side walls as a mask.

In another embodiment, the present invention provide a method of fabricating a semiconductor device includes the step of:

(iv) forming low impurity concentration portions of source and drain regions of an LDD structure by implanting ions which are of the second conductive type and have a predetermined energy and dose using the gate electrode as a mask;

(v) forming a pair of side walls on opposing walls of the gate electrode by disposing an insulation layer to a predetermined thickness and subsequently subjecting to an etch back process; and (iii) forming a portion of the well region having a low net concentration of the first conductive type ions by implanting ions, using the gate electrode and the pair of side walls as a mask, which are of a second conductive type opposite to the first conductive type, a predetermined dose and an energy predetermined so as for the ions to be able to penetrate through the gate electrode and reach the surface of the semiconductor substrate, in place of the aforementioned steps of:

(iii) forming a portion of the well region having a low net concentration of the first conductive type ions by implanting ions, into the entire area of the semiconductor substrate using the gate electrode as a mask, which are of a second conductive type opposite to the first conductive type, a predetermined dose and an energy predetermined so as for the ions to be able to penetrate through the gate electrode and reach a surface portion of the semiconductor substrate;

(iv) forming low impurity concentration portions of source and drain regions of an LDD structure by implanting ions which are of the second conductive type and have a predetermined energy and dose using the gate electrode as a mask; and (v) forming a pair of side walls on opposing walls of the gate electrode by disposing an insulation layer to a predetermined thickness and subsequently subjecting to an etch back process.

BRIEF DESCRIPTION OF THE DRAWINGS

Preferred embodiments of the invention are described hereinbelow with reference to the drawings wherein.

DESCRIPTION OF THE ILLUSTRATIVE EMBODIMENTS

A MOS field effect transistor in accordance with the present invention includes a non-uniformly doped well region composed of two portions. One portion is a low net impurity concentration portion which is contiguous to source and drain regions and situated under a gate electrode, and which has a first net concentration of the first conductive type impurities. The other portion is the remainder of the well, which has a second impurity concentration higher than the first concentration.

Typically, during a high energy ion implantation, ion energies are generally adjusted so as to achieve a maximum concentration at a certain inside location of the well. Therefore, if a well region is formed by implanting ions, it is expected that the well region will have a depth profile in which the impurity concentration is lower toward the surface of, and higher toward the inside of the well (i.e., a 'retrograded' depth profile).

However, if a similar implantation is carried out to fabricate the present transistor structure by high energy ion implantation alone, a plurality of ion implantation processes are necessary such as (1) a high dose implantation into a deep well region and (2) a low dose implantation into a surface and a source or drain junction region to decrease junction capacitance. As a result, a channel region results, having a broad low impurity concentration region under the channel region and this is not advantageous for desired characteristics such as, for example, suppressing the aforementioned punch-through effect.

By contrast, the formation of a well region of the present invention starts with a thermal diffusion process which produces a depth profile relatively uniform with the depth from the surface of the substrate.

More specifically, a well region, having a uniform and high impurity concentration is formed with relative ease by a thermal diffusion process using impurities of a first conduction type. Subsequently, a portion of the well region having a low net first conductive type impurity concentration is formed by implanting ions which are of a second conductive type opposite to the first conductive type. By this implantation, a relatively upper portion of the uniform and high impurity concentration well region is transformed to a low net concentration portion of the first conductive type ions by compensating for a part of the previously diffused first conductive type ions by the presently implanted second conductive type ions. Furthermore, by using a mask during the implantation, the location of the low net impurity concentration may arbitrarily be selected.

Figure 1:
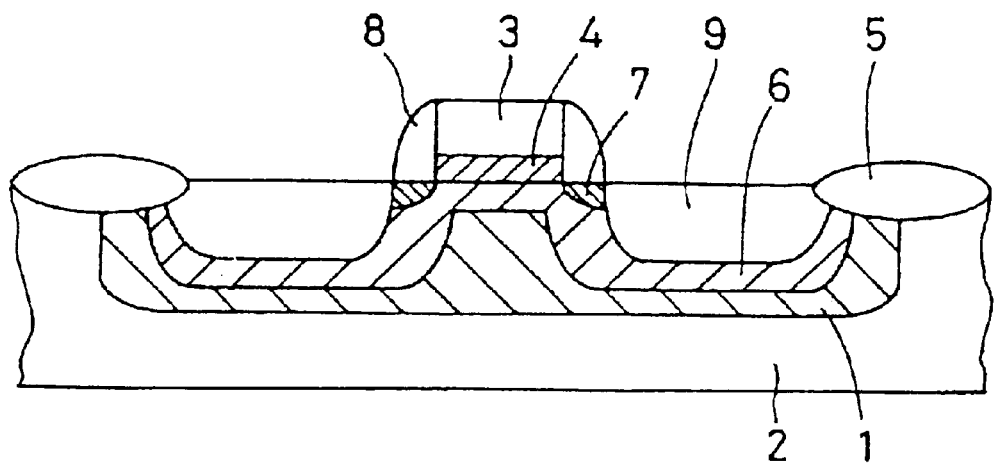
FIG. 1 is a cross-sectional view illustrating a p-type semiconductor device in accordance with an embodiment of the present invention.

By the above-mentioned processes, the structure of a field effect transistor is fabricated as shown in FIG. 1, which includes the aforementioned well region having two portions, one a low net first conductive type impurity concentration portion 6 which is contiguous to source and drain regions and which is situated under a gate electrode, and the other the remaining high impurity concentration portion 1 of the well, having the same conductive type as that of the above portion 6.

A fabrication method of a field effect transistor of the present invention includes the steps of forming a well region in a semiconductor substrate by a thermal diffusion process, which has a high impurity concentration of a first conductive type;

forming a gate electrode by disposing a conductive layer with an underlying insulation layer and subsequently subjecting to a patterning process using a conventional photolithography technology; and forming a portion of the well region having a low net concentration of the first conductive type ions by implanting ions into the entire area of the semiconductor substrate using the gate electrode as a mask, which are of a second conductive type opposite to the first conductive type and an energy predetermined so that the ions are able to penetrate through the gate electrode and reach a surface portion of the semiconductor substrate (e.g., the well region under the gate electrode), thereby the well region of the field effect transistor is formed, having (1) a first relatively shallow portion which is situated directly under the gate electrode used as a mask and (2) a second portion deeper in the well region, which is situated in areas remains without coverage by the gate electrode against the ion implantation, both portions being transformed to a low net concentration region of the first conductive type ions by compensating for a part of the previously diffused first conductive type ions by the implanted second conductive type ions.

To be more specific, fabrication steps of the present invention include:

(a) forming a well region in a semiconductor substrate by a thermal diffusion process, having a high impurity concentration of a first conductive type;

(b) forming a gate electrode with an underlying insulation layer, by disposing a conductive layer and subsequently subjecting to a patterning process using the conventional photolithography technology;

(c) forming a portion of the well region having a low net concentration of the first conductive type ions by implanting ions, into the entire area of the semiconductor substrate using the gate electrode as a mask, which are of a second conductive type opposite to the first conductive type and an energy predetermined so as for the ions to be able to penetrate through the gate electrode and reach a surface portion of the semiconductor substrate.

The steps may include (d) forming low second conductive type impurity concentration portions of source and drain regions of a lightly doped drain (LDD) structure by implanting ions which are of the second conductive type and have a predetermined energy and dose using the gate electrode as a mask;

(e) forming a pair of side walls on opposing walls of the gate electrode by disposing an insulation layer to a predetermined thickness and subsequently subjecting to an etch back process; and (f) forming high net second conductive type impurity concentration portions of source and drain regions by implanting ions which are of the second conductive type and have a predetermined energy and dose using the gate electrode and the pair of side walls as a mask.

As another method of the fabrication, in place of the above-described steps (d), (e) and (f), a method may include:

(g) forming low second conductive type impurity concentration portions of source and drain regions of an LDD structure by implanting ions which are of the second conductive type and have a predetermined energy and dose using the gate electrode as a mask;

(h) forming a pair of side walls on opposing walls of the gate electrode by disposing an insulation layer to a predetermined thickness and subsequently subjecting to an etch back process; and (i) forming a portion of the well region having a low net concentration of the first conductive type ions by implanting ions, using the gate electrode and the pair of side walls as a mask, which are of a second conductive type opposite to the first conductive type, a predetermined dose and an energy predetermined so that the ions are able to penetrate through the gate electrode and reach a surface portion of the semiconductor substrate.

For the formation of the above-mentioned well region in the present invention, when the first and second conductive types are n- and p-types, respectively, and the thickness of a conductive layer for a gate electrode is from 100 to 300 nanometers thick, ions of the second type (i.e., p-type) to be implanted may preferably be boron ions of an energy of from 20 to 80 keV, or $BF_2$ ions of an energy of from 90 to 350 keV.

In a similar manner, when the first and second conductive types are p- and n-types, respectively, and the thickness of a conductive layer for a gate electrode is from 100 to 300 nanometers thick, ions of the second type (i.e., n-type) to be implanted may preferably be phosphorus ions of an energy of from 50 to 190 keV, or arsenic ions of an energy of from 100 to 450 keV.

A description is given of a first embodiment of the present invention with reference to FIG. 1, which illustrates a cross section of a field effect transistor of a preferred embodiment of the present invention. In the following description, a p-channel field effect transistor is assumed.

Referring to FIG. 1, a p-channel field effect transistor includes a well region, a gate insulation layer 4, low p-type impurity concentration layers 7 and a pair of side walls 8 for the formation of a lightly doped drain (LLD) structure.

The well region is formed on a p-type silicon substrate 2, having a low net n-type impurity concentration portion 6, which is contiguous to high p-type impurity concentration source and drain regions 9, and located under a gate electrode 3; and the remaining portion 1 of the well, which has a high n-type impurity concentration.

Referring to FIGS. 2A through 2E, the fabrication processes of a p-channel MOS transistor in accordance with a first embodiment of the present invention will be described.

(a) An n-type high impurity concentration well region 1 is formed on a p-type silicon substrate 2, by firstly implanting phosphorus ions of an energy of approximately 160 keV and a dose of approximately $6 \times 10^{13} cm^{-2}$ and then subjecting to a thermal diffusion process for 70 minutes at approximately 1000° C., so that a depth of the well of approximately 2.5 microns with an impurity concentration of approximately $4 \times 10^{17} cm^{-3}$ results.

A field oxide layer 5 of silicon oxide for isolation is then formed on a main surface of the well region 1 by a selective thermal oxidation process in which openings for source and drain regions and gate electrode region are defined using an oxidation mask film (not shown).

Thereafter, an insulation layer 4 of a thickness of approximately 5 nanometers, and thereupon a conductive layer 3 of a thickness of approximately 200 nanometers are formed. By subjecting these layers to a patterning process using conventional photolithography technology, a gate electrode 3 is formed.

Figure 2A:
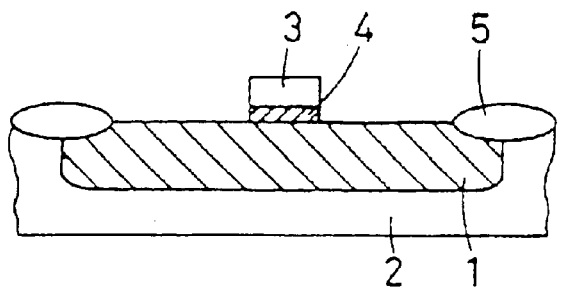
FIGS. 2A through 2E are cross-sectional views of a semiconductor device in accordance with a first embodiment of the present invention during various stages in the fabrication process.
Figure 2B:
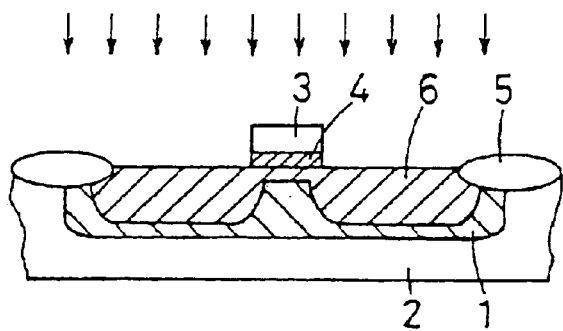

(b) Referring to FIG. 2B, implantation into the previously formed n-type high impurity concentration well region 1 through the gate electrode 3 is carried out with boron ions of an energy of approximately 40 keV and a dose of approximately $5 \times 10^{12} cm^{-2}$, so that the implanted boron ions penetrate (1) through the gate electrode and reach a surface portion of the semiconductor substrate under the gate electrode and (2) through the openings for the source and the drain, and reach the source and drain regions deeper into the region 1, thereby forming an n-type region 6 which has a net n-type impurity concentration of approximately $8 \times 10^{16} cm^{-3}$ (i.e., an impurity concentration lower than the aforementioned impurity concentration of $4 \times 10^{17} cm^{-3}$ obtained by the thermal diffusion process).

Figure 2C:
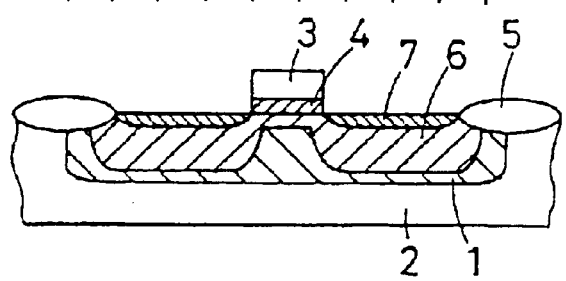

(c) Low net p-type impurity concentration portions 7 in source and drain regions of an LDD structure are formed, as shown in FIG. 2C, by implanting p-type ions of a lower energy into the low net impurity concentration n-type region 6 using the gate electrode as a mask, and compensating for some of the n-type ions in relatively shallow portions of the substrate by the presently implanted p-type ions.

Figure 2D:
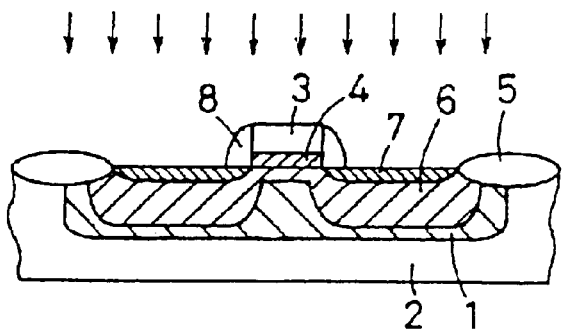

(d) An insulation layer is then formed to a thickness of 150 nanometers, and etched back by, for example, an anisotropic dry etching method, to form a pair of side walls 8 on the opposing walls of the gate electrode 3, as shown in FIG. 2D.

Figure 2E:
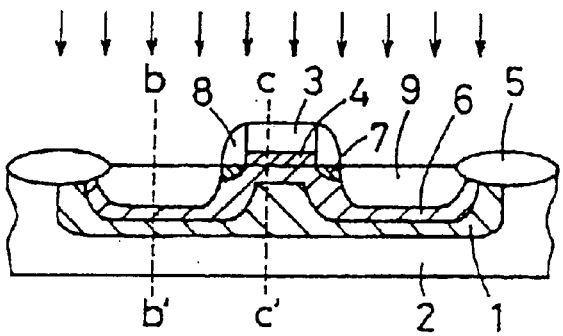

(e) By implanting p-type ions into the low net impurity concentration n-type region 6 using the gate electrode and the pair of the side walls as a mask, source and drain regions 9 are formed having a high net p-type impurity concentration as shown in FIG. 2E.

Figure 4A:
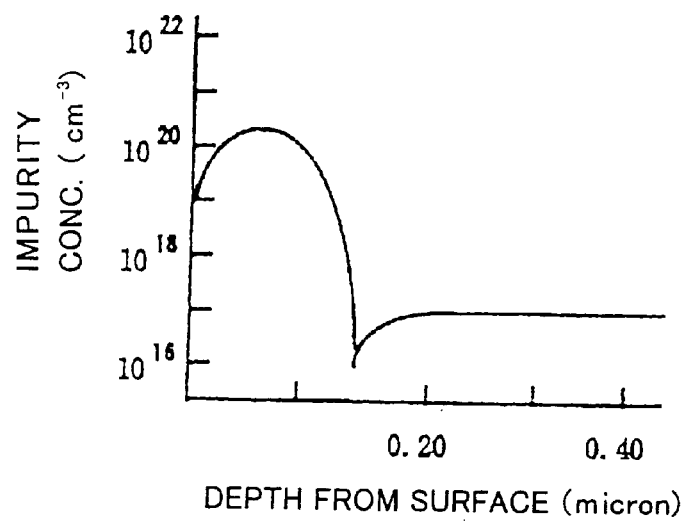
FIG. 4A shows a depth profile of the impurity concentration obtained in a source or drain junction region of a conventional semiconductor device of FIG. 5.
Figure 4B:
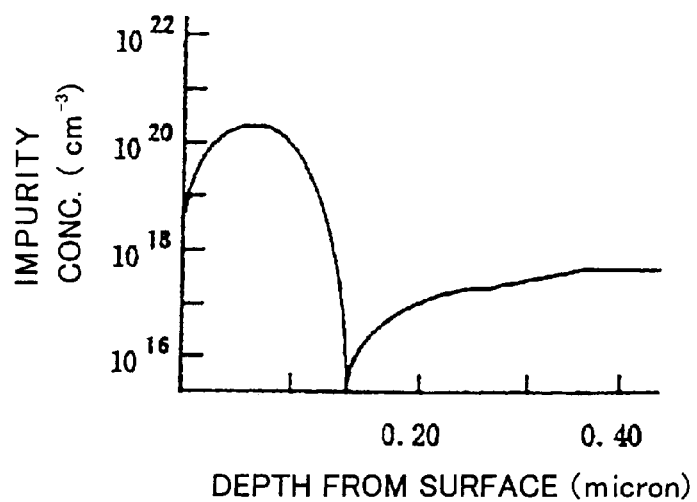
FIG. 4B shows a depth profile of the impurity concentration obtained in a source or drain junction region along the line b–b' of the structure of FIG. 2E.
Figure 4C:
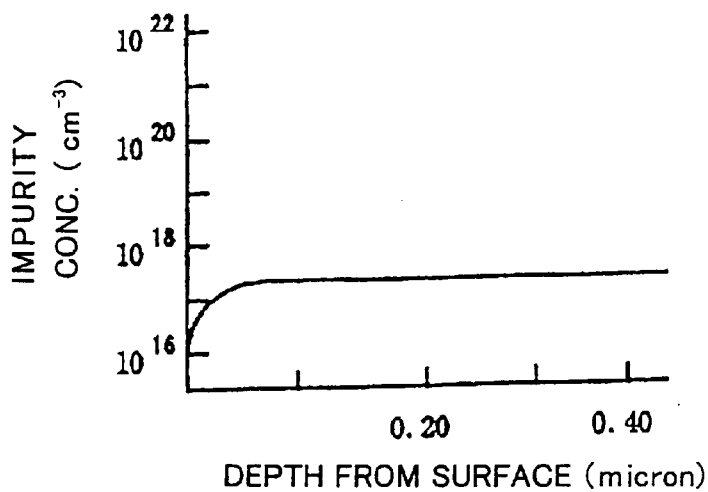
FIG. 4C shows a depth profile of the impurity concentration obtained in a channel region along the line c–c' of the structure of FIG. 2E.
Figure 5:
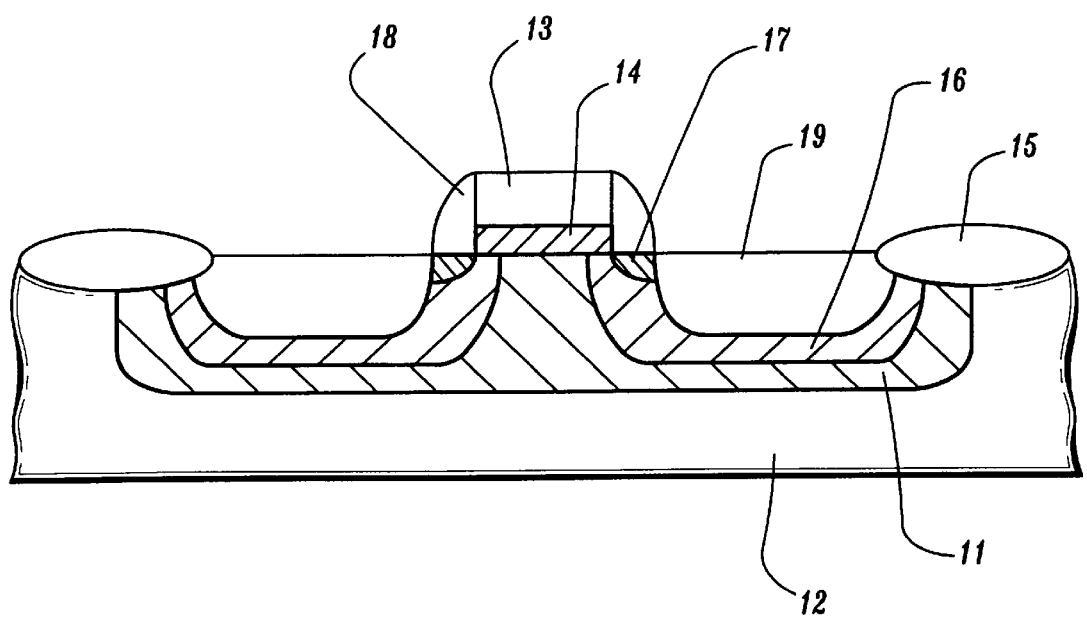
FIG. 5 is a cross-sectional view illustrating a conventional semiconductor device.

For the p-channel field effect transistor fabricated as above, impurity concentrations are analyzed through a source or drain junction region and the channel region to obtain depth profile results which are shown in FIGS. 4B and 4C along the lines b—b' and c—c' of the structure of FIG. 2E, respectively. Depth profile results of the impurity concentration in a source or drain for a conventional semiconductor device are shown in FIG. 4A.

In comparing the results in FIG. 4B with those in FIG. 4A, it is clearly indicated that, in the presently fabricated device, (a) the net impurity concentration at both the source or drain junction region and the well portions contiguous to the junction regions are smaller, and (b) the impurity concentration stays higher in a deeper portion in the well than in the conventional semiconductor device (FIG. 4A), resulting in a wider depleted region and thereby a reduced junction capacitance.

FIGS. 2A through 2E may also be referred to, to describe a fabrication process of an n-channel field effect transistor in accordance with the first embodiment of the present invention.

(a) A net p-type high impurity concentration well region 1 is formed on an n-type silicon substrate 2, by firstly implanting boron ions of an energy of approximately 15 keV and a dose of approximately $6 \times 10^{13} cm^{-2}$ and then subjecting to a thermal diffusion process for 65 minutes at approximately 1150° C., so that a depth of the well of approximately 2.5 microns with an impurity concentration of approximately $4 \times 10^{17} cm^{-3}$ results.

A field oxide layer 5 of silicon oxide for isolation is then formed on a main surface of the well region 1 by a selective thermal oxidation process in which openings for source and drain regions and gate electrode region are defined using an oxidation mask film (not shown).

Thereafter, an insulation layer 4 of a thickness of approximately 5 nanometers, and thereupon a conductive layer 3 of a thickness of approximately 200 nanometers are formed. By subjecting these layers to a patterning process using conventional photolithography technology, a gate electrode 3 is formed.

(b) Referring to FIG. 2B, implantation into the p-type high impurity concentration well region 1 through the gate electrode 3 is carried out with phosphorus ions of an energy of approximately 110 keV and a dose of approximately $3.5 \times 10^{12} cm^{-2}$, so that the implanted phosphorus ions penetrate (1) through the gate electrode and reach a surface portion of the semiconductor substrate under the gate electrode and (2) through the openings for the source and the drain, and reach the source and drain regions deeper into the region 1, thereby forming a p-type region 6 which has a net p-type impurity concentration of approximately $8 \times 10^{16} cm^{-3}$ (i.e., a lower impurity concentration).

(c) low net n-type impurity concentration portions 7 of source and drain regions of an LDD structure are formed, as shown in FIG. 2C, by implanting n-type ions of a lower energy into the low net impurity concentration p-type region 6 using the gate electrode as a mask, and compensating for some of the p-type ions in relatively shallow portions of the substrate by the presently implanted n-type ions.

(d) An insulation layer is then formed to a thickness of 150 nanometers, and etched back by, for example, an anisotropic dry etching method, to form a pair of side walls 8 on the opposing walls of the gate electrode 3, as shown in FIG. 2D.

(e) By implanting n-type ions into the low net impurity concentration p-type region 6 using the gate electrode 3 and the pair of side walls 8 as a mask, source and drain regions 9 are formed having a high net n-type impurity concentration as shown in FIG. 2E.

Referring to FIGS. 3A through 3E, the fabrication processes of a p-channel field effect transistor in accordance with a second embodiment of the present invention will be described.

(a) A net n-type high impurity concentration well region 1 is formed on a p-type silicon substrate 2, by firstly implanting phosphorus ions of an energy of approximately 160 keV and a dose of approximately $6 \times 10^{13} cm^{-2}$ and then subjecting to a thermal diffusion process for 70 minutes at approximately 1000° C., so that a depth of the well of approximately 2.5 microns with an impurity concentration of approximately $4 \times 10^{17} cm^{-3}$ results.

A field oxide layer 5 of silicon oxide for isolation is then formed on a main surface of the well region 1 by a selective thermal oxidation process in which openings for source and drain regions and gate electrode region are defined using an oxidation mask film (not shown).

Thereafter, an insulation layer 4 of a thickness of approximately 5 nanometers, and thereupon a conductive layer 3 of a thickness of approximately 200 nanometers are formed. By subjecting these layers to a patterning process using conventional photolithography technology, a gate electrode 3 is formed.

Figure 3A:
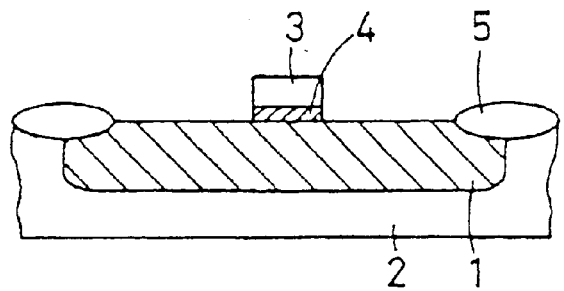
FIGS. 3A through 3E are cross-sectional views of a semiconductor device in accordance with a second embodiment of the present invention during the fabrication process.
Figure 3B:
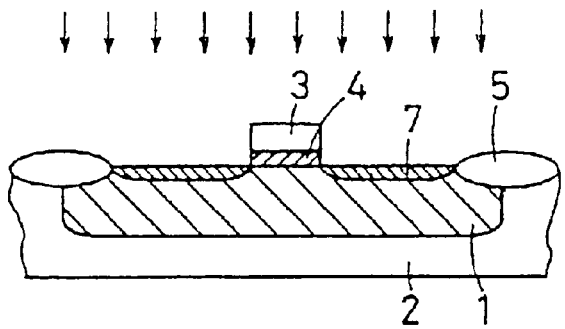

(b) Low net p-type impurity concentration portions 7 of source and drain regions of an LDD structure are formed, as shown in FIG. 3B, by implanting p-type ions of a lower energy into the high net impurity concentration n-type region 1 using the gate electrode as a mask, and compensating for some of the n-type ions in relatively shallow portions of the substrate by the presently implanted p-type ions.

Figure 3C:
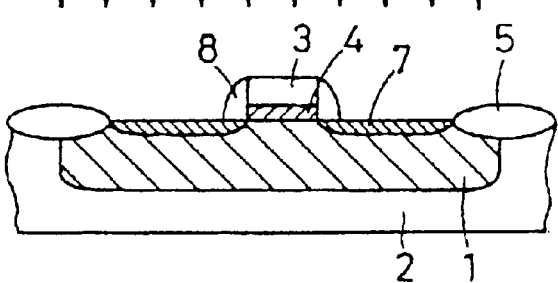

(c) An insulation layer is then formed to a thickness of 150 nanometers, and etched back by, for example, an anisotropic dry etching method, to form a pair of side walls 8 on the opposing walls of the gate electrode 3, as shown in FIG. 3C.

Figure 3D:
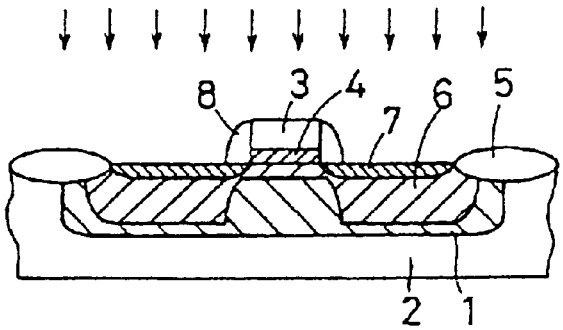

(d) Referring to FIG. 3D, implantation into the previously formed n-type high impurity concentration well region 1 through the gate electrode 3 and the side walls 8 is carried out with boron ions of an energy of approximately 40 keV and a dose of approximately $5 \times 10^{12} cm^{-2}$, so that the implanted boron ions penetrate (1) through the gate electrode 3 and the side walls 8, and reach a surface portion of the semiconductor substrate under the gate electrode 3 and (2) through the openings for source and drain junction regions deeper into the region 1, thereby forming an n-type region 6 which has a net impurity concentration of approximately $8 \times 10^{16} cm^{-3}$ (i.e., a lower impurity concentration).

Figure 3E:
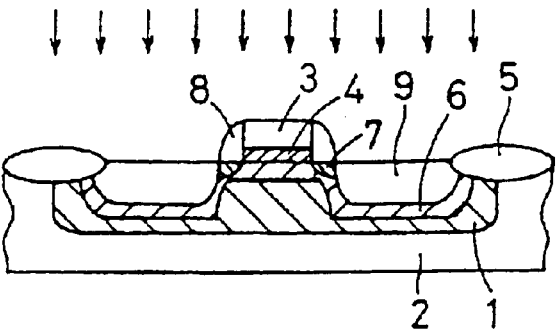

(e) By implanting p-type ions into the low net impurity concentration n-type region 6 using the gate electrode and the pair of side walls as a mask, source and drain regions 9 are formed having a high net p-type impurity concentration as shown in FIG. 3E.

FIGS. 3A through 3E may also be referred to, to describe a fabrication process of an n-channel field effect transistor in accordance with the second embodiment of the present invention.

(a) A p-type high net impurity concentration well region 1 is formed on an n-type silicon substrate 2, by firstly implanting boron ions of an energy of approximately 15 keV and a dose of approximately $6 \times 10^{13} cm^{-2}$ and then subjecting to a thermal diffusion process for 65 minutes at approximately 1150° C., so that a depth of the well of approximately 2.5 microns with an impurity concentration of approximately $4 \times 10^{17}$ cm$^{-3}$ results.

A field oxide layer 5 of silicon oxide for isolation is then formed on a main surface of the well region 1 by a selective thermal oxidation process in which openings for source and drain regions and gate electrode region are defined using an oxidation mask film (not shown).

Thereafter, an insulation layer 4 of a thickness of approximately 5 nanometers, and thereupon a conductive layer 3 of a thickness of approximately 200 nanometers are formed. By subjecting these layers to a patterning process using conventional photolithography technology, a gate electrode 3 is formed.

(b) Low net n-type impurity concentration portions 7 of source and drain regions of an LDD structure are formed, as shown in FIG. 3B, by implanting n-type ions of a lower energy into the high impurity concentration p-type region 1 using the gate electrode as a mask, and compensating some of the p-type ions in relatively shallow portions of the substrate by the presently implanted n-type ions.

(c) An insulation layer is then formed to a thickness of 150 nanometers, and etched back by, for example, an anisotropic dry etching method, to form a pair of side walls 8 on the opposing walls of the gate electrode 3, as shown in FIG. 3C.

(d) Referring to FIG. 3D, implantation into the previously formed p-type high impurity concentration well region 1 through the gate electrode 3 and the side walls 8 is carried out with phosphorus ions of an energy of approximately 110 keV and a dose of approximately $3.5 \times 10^{12} cm^{-2}$, so that the implanted phosphorus ions penetrate (1) through the gate electrode 3 and the side walls 8, and reach a surface portion of the semiconductor substrate under the gate electrode 3 and (2) through the openings for source and drain junction regions deeper into the region 1, thereby forming a p-type region 6 which has a net impurity concentration of approximately $8 \times 10^{16} cm^{-3}$ (i.e., a lower impurity concentration).

(e) By implanting n-type ions into the low net impurity concentration p-type region 6 using the gate electrode and the pair of the side walls as a mask, source and drain regions 9 are formed having a high net n-type impurity concentration as shown in FIG. 3E.

In fabrication processes of the second embodiment mentioned above, the pair of side walls on opposing walls of the gate electrode may preferably be composed of silicon nitride. By the use of silicon nitride side walls as a mask in place of a silicon oxide mask, the range of implanted ions is smaller than when silicon dioxide side walls are used, thereby resulting in a thicker high concentration well region (i.e., a thinner low concentration well region) under the gate electrode, which is more advantageous for suppressing the aforementioned punch-through effect.

During implanting ions through the gate electrode, it is preferable for the ions to have satisfactory energies to reach (1) just a surface portion without penetrating much deeper into the well region below the gate electrode and (2) the source and drain junction region deeper under the openings for the source or drain regions. The depth of implanted ions is determined by a gate electrode thickness as well as an ion energy. It has been found that a thickness of from 0.1 to 0.2 microns of the above-mentioned surface portion desirable for the present device may preferably be achieved with a gate electrode thickness of from 100 to 300 nanometers. For these gate electrode thicknesses, energies of implanted ions are preferably from 20 to 80 keV for boron ions, from 90 to 350 keV for $BF_2$ ions, from 50 to 190 keV for phosphorus ions and 100 to 450 keV for arsenic ions.

As described hereinbefore, the field effect transistor in accordance with the present invention has a structure, of which a well region as a whole has a high net impurity concentration, while junction regions of the source and drain regions have a low net impurity concentration.

In the field effect transistor, as shown in FIG. 4B, the net impurity concentration in both the source or drain junction region and the well portions contiguous to the junction regions are smaller, and the impurity concentration stays higher in a deeper portion in the well, than in the conventional semiconductor device (FIG. 4A). This results in a wider depleted region and thereby a reduced junction capacitance, which is advantageous to improve high frequency characteristics of the field effect transistor.

Also, as shown in FIG. 4C, by the small and predetermined concentration of the channel region formed by ion implantation through the gate electrode, threshold voltages for the transistor driving can be reduced, enabling a low voltage driving and thereby a lower power consumption of the field effect transistor.

The above-mentioned high impurity concentration of the well region is useful for manufacturing the transistors with a reduced design rule.

In addition, fabrication processes of the present invention are also useful for forming a high impurity concentration region under a field oxide 5 (FIG. 1). This allows another field doping process, which is generally carried out prior to the formation of the field oxides to prevent the formation of field transistors in that area, to be eliminated.

Additional modifications and variations of the present invention are possible in light of the above teachings. It is therefore to be understood that within the scope of the appended claims, the invention may be practiced otherwise than as specifically described herein.

What is claimed is:

1. A field effect transistor device, comprising:

a semiconductor substrate:

a well region of a first conduction type formed in said semiconductor substrate, said semniconductor substrate having source and drain regions each having a second conduction type opposite to that of said first conduction type; and a gate electrode with an underlying insulation layer, formed between said source and drain regions, wherein said well region has at least two portions including (1) a first portion, which is contiguous to said underlying insulation layer and said source and drain regions and situated under said gate electrode at a lesser depth than under said source and drain regions, and has a first net concentration of first conductive type impurities, and (2) a second portion having a substantially flat bottom which has a second net concentration higher than said first net concentration of said first conductive type impurities.

2. A field effect transistor device, comprising:

a semiconductor substrate:

a well region of a first conduction type formed in said semiconductor substrate, said semiconductor substrate having source and drain regions each having a second conduction type opposite to that of said first conduction type; and a gate electrode with an underlying insulation layer, formed between said source and drain regions, wherein said well region has at least two portions each of which extends at least between said source and drain regions, the at least two portions including (1) a first portion, which is contiguous to said underlying insulation layer and said source and drain regions and situated under said gate electrode at a lesser depth than under said source and drain regions, and has a first net concentration of first conductive type impurities, and (2) a second portion having a substantially flat bottom which has a second net concentration higher than said first net concentration of said first conductive type impurities.

3. A field effect transistor device as recited in claim 2, wherein the first and second portions of the well region extend in parallel to each other.

4. A field effect transistor device as recited in claim 3, wherein the first portion of the well region is provided on the second portion of the well region.

5. A field effect transistor device as recited in claim 3, wherein the at least two portions of the well region extend under the source and drain regions.

6. A field effect transistor device as recited in claim 3, wherein the at least two portions of the well region extend between isolation regions which isolate the field effect transistor device.

* * * * *